US008828813B2

(12) United States Patent
Huang et al.

(10) Patent No.: US 8,828,813 B2
(45) Date of Patent: Sep. 9, 2014

(54) REPLACEMENT CHANNELS

(75) Inventors: Yu-Lien Huang, Jhubei (TW);
Meng-Chun Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 141 days.

(21) Appl. No.: 13/446,375

(22) Filed: Apr. 13, 2012

(65) Prior Publication Data

US 2013/0270628 A1    Oct. 17, 2013

(51) Int. Cl.
*H01L 21/338*    (2006.01)

(52) U.S. Cl.
USPC ............... 438/183; 438/300; 257/E21.444; 257/E21.453

(58) Field of Classification Search
USPC .......................................... 438/183
See application file for complete search history.

(56) References Cited

U.S. PATENT DOCUMENTS

2006/0113591 A1* 6/2006 Wan et al. .............. 257/335
2009/0061586 A1* 3/2009 Yu et al. ................. 438/296
2011/0291189 A1* 12/2011 Cheng et al. ........... 257/347

OTHER PUBLICATIONS

Wen-Shiang Liao, et al., "PMOS Hole Mobility Enhancement Through SiGe Conductive Channel and Highly Compressive ILD-SiNx Stressing Layer", IEEE Electron Device Letters, vol. 29, No. 1, Jan. 2008, p. 86-88.
Sophie Verdonckt-Vandebroek, et al., "High-Mobility Modulation-Doped Graded SiGe-Channel p-MOSFET's", IEE Electron Device Letters, vol. 12, No. 8, Aug. 1991, p. 447-449.
Guangrui Xia, "SiGe and Stress Technology for CMOS and Beyond", UBC, Materials Engineering, Microsystems and Nanotechnology Group.

* cited by examiner

*Primary Examiner* — W. Wendy Kuo
*Assistant Examiner* — Skaka White
(74) *Attorney, Agent, or Firm* — Eschweiler & Associates, LLC

(57) ABSTRACT

The present disclosure relates to a device and method for strain inducing or high mobility channel replacement in a semiconductor device. The semiconductor device is configured to control current from a source to a drain through a channel region by use of a gate. A strain inducing or high mobility layer produced in the channel region between the source and drain can result in better device performance compared to Si, faster devices, faster data transmission, and is fully compatible with the current semiconductor manufacturing infrastructure.

22 Claims, 15 Drawing Sheets

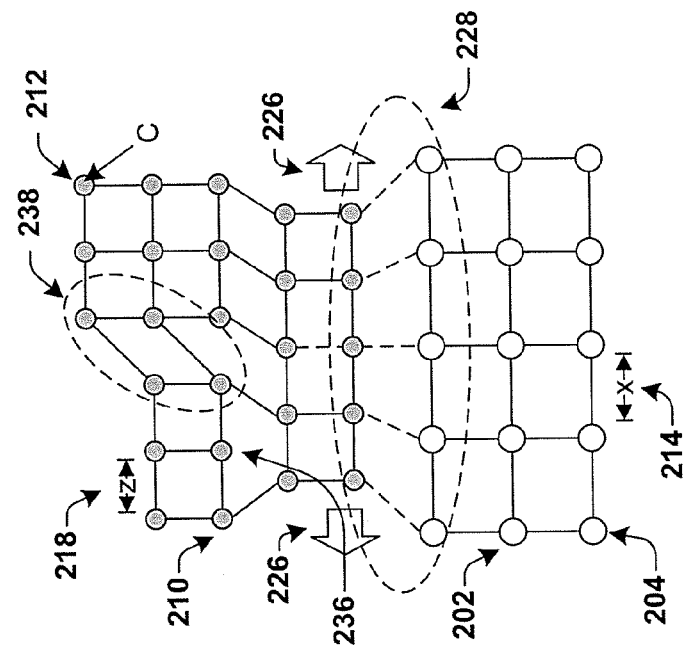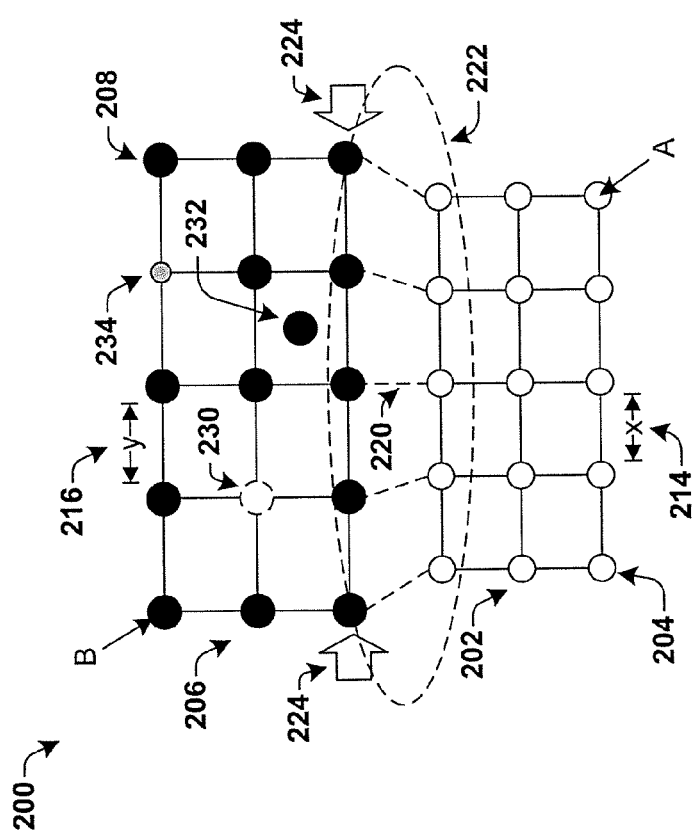
Fig. 2

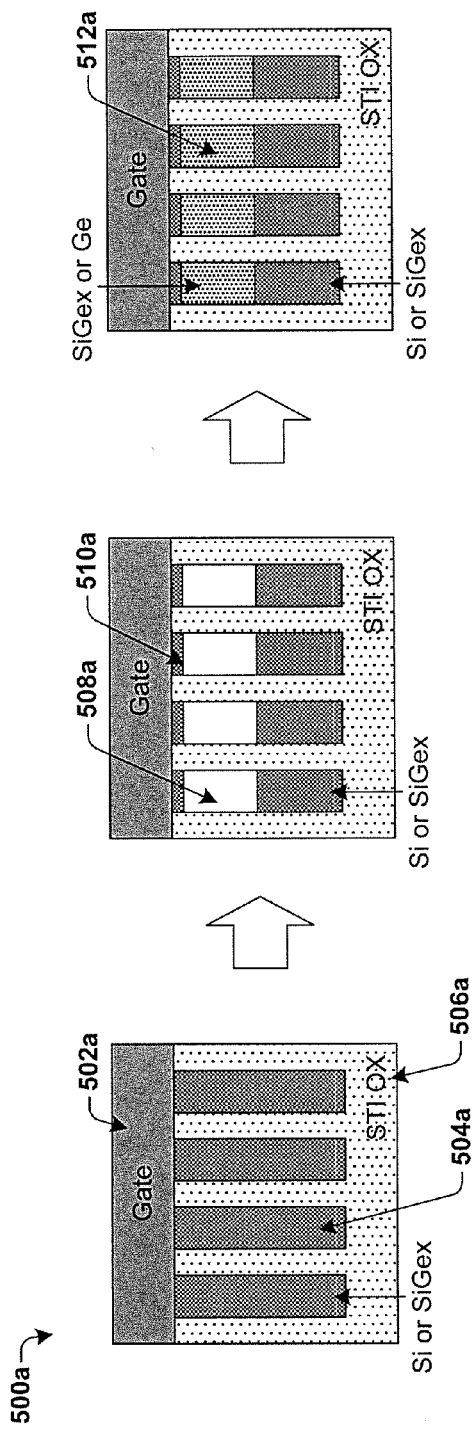
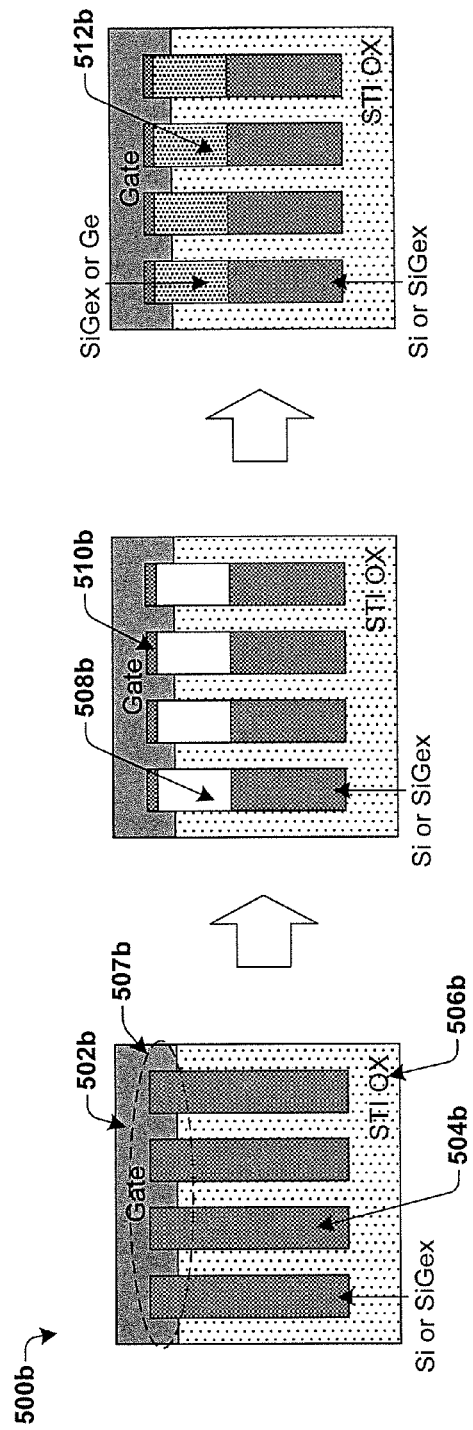
Fig. 5a
Fig. 5b

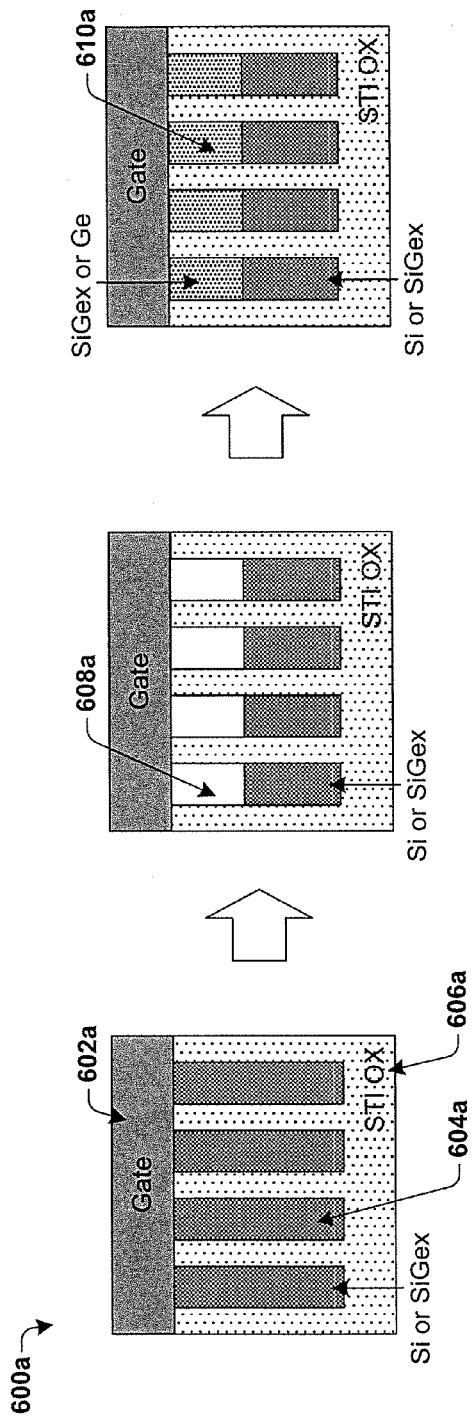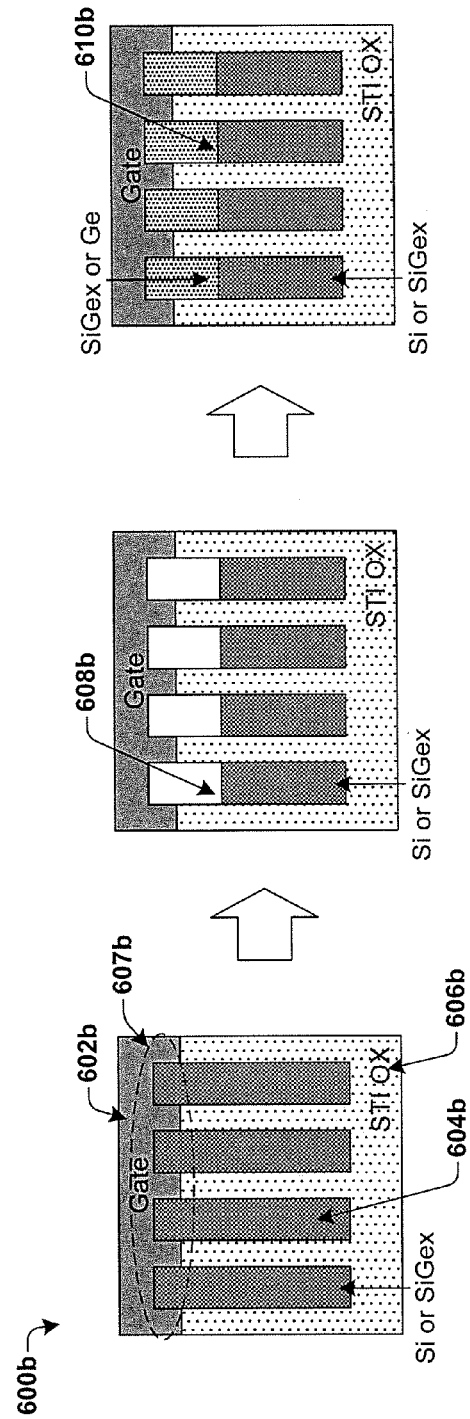
Fig. 6a
Fig. 6b

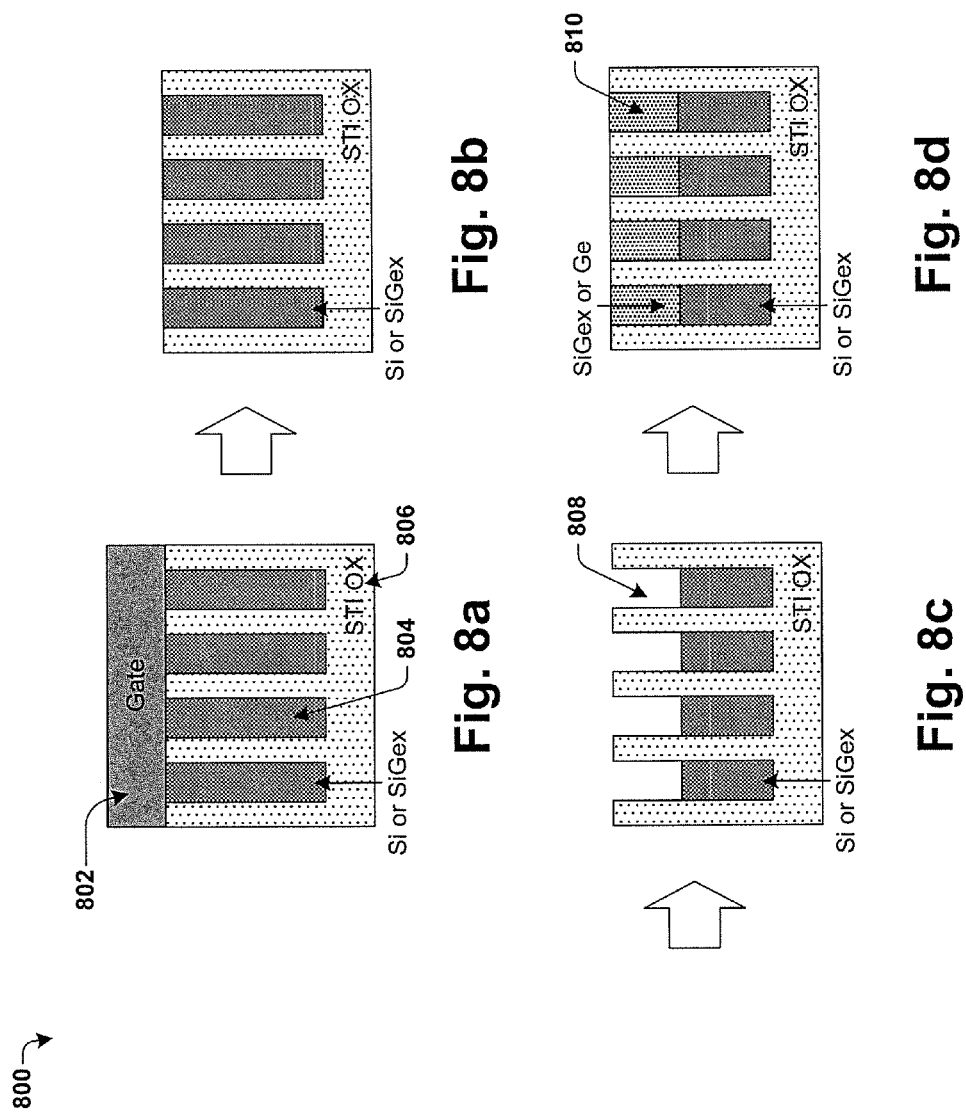

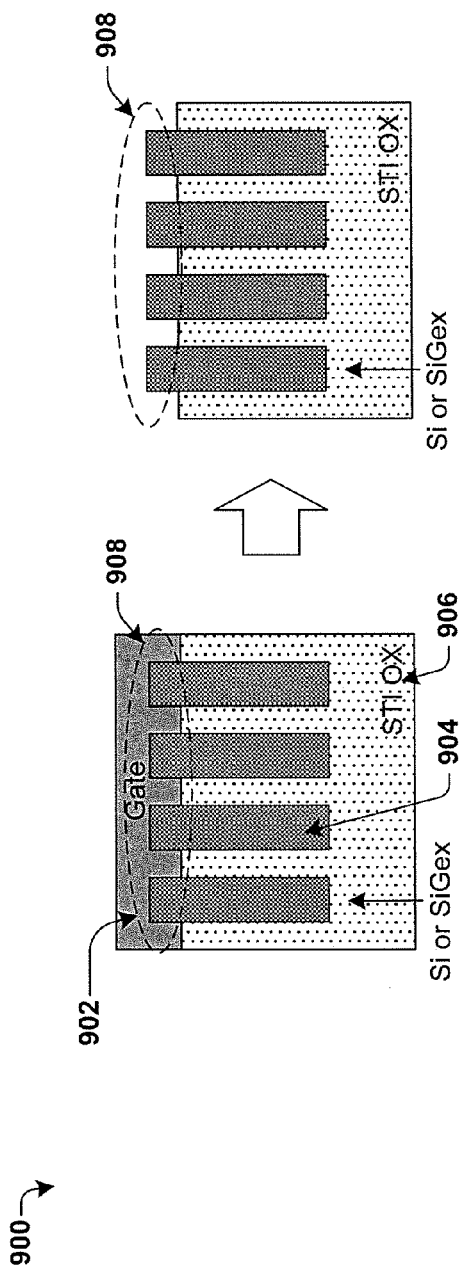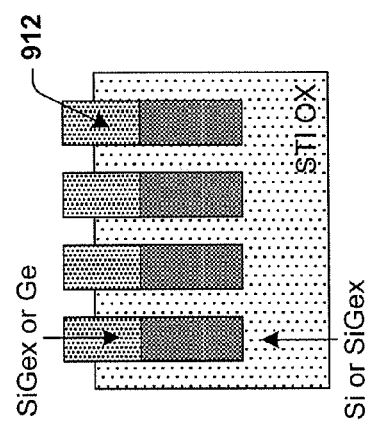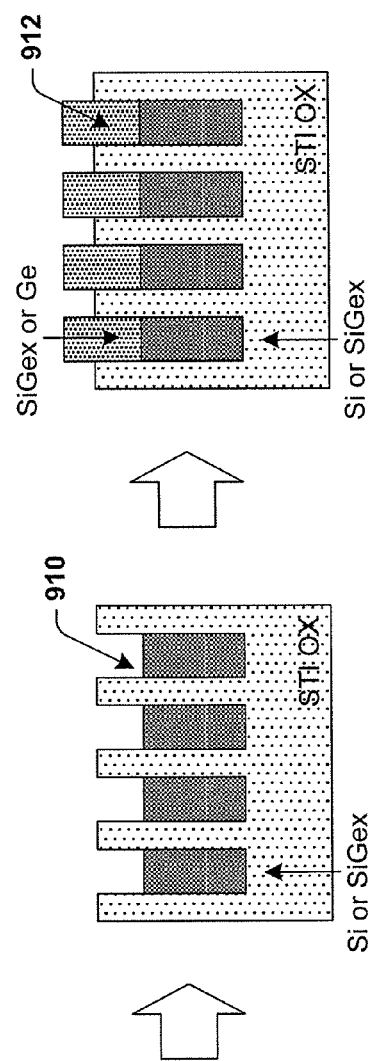

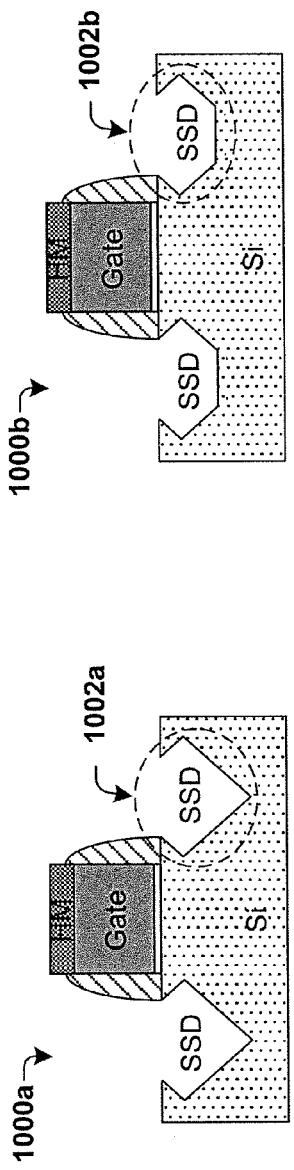
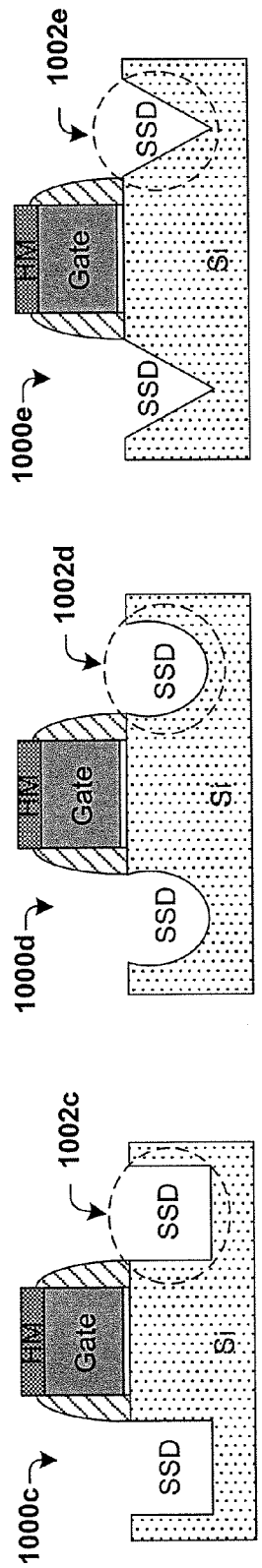

REPLACEMENT CHANNELS

BACKGROUND

The cost and complexity associated with scaling of semiconductor device sizes according to Moore's law has given rise to new methods to improve semiconductor device characteristics. New gate materials such as Hi-K metal gates to decrease device leakage, finFET devices with increased effective gate area as compared to same-size planar devices, and strain inducing channels for increased charge carrier mobility are a few examples of methods to continue Moore's Law scaling for next generation microprocessor designs.

BRIEF DESCRIPTION OF THE DRAWINGS

FIG. 2 illustrates some embodiments of strained lattices.

FIG. 5a illustrates some embodiments of forming a partial replacement channel on planar FETs.

FIG. 5b illustrates some embodiments of forming a partial replacement channel on finFETs.

FIG. 6a illustrates some embodiments of forming a full replacement channel on planar FETs.

FIG. 6b illustrates some embodiments of forming a full replacement channel on finFETs.

FIG. 8a-FIG. 8d illustrate some embodiments of forming a channel-last replacement channel on planar FETs in a Hi-K metal gate last (HKL) flow.

FIG. 9a-FIG. 9d illustrate some embodiments of forming a channel-last replacement channel on finFETs in a Hi-K metal gate last (HKL) flow.

FIG. 10a-FIG. 10e illustrate cross-sectional views of some embodiments of typical SSD etch profiles.

DETAILED DESCRIPTION

Figure 1:
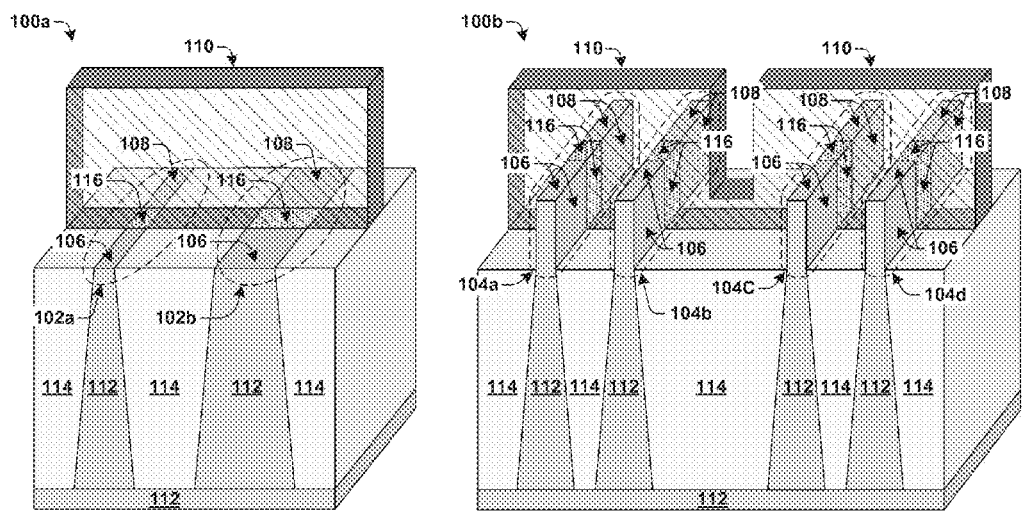
FIG. 1 illustrates semiconductor devices with strain inducing channels formed by conventional methods.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1 illustrates semiconductor devices with strain inducing channels formed by conventional methods, comprising an arrangement 100a of two planar field-effect transistors (FETs) 102a and 102b, as well as an arrangement 100b of four fin field-effect transistors (finFETs) 104a-104d. Each FET 102a-102b and finFET 104a-104d comprise three terminals: a source 106, a drain 108, and a gate 110, and are formed on a silicon (Si) substrate 112 and isolated by shallow trench isolation (STI) channels 114 filled with a dielectric material (e.g., $SiO_2$). Planar FETs 102a-102b and finFETs 104a-104d typically comprises a metal-oxide-semiconductor FETs (MOSFETs) wherein a Hi-K dielectric resides between the gate 110 and a channel region 116 formed between each source 106 and drain 108 to reduce power loss due to gate current leakage into the channel region 116.

One factor in determining the performance of a FET is the mobility of charge carriers through the channel region 116. To increase the mobility of charge carriers in a FET, a strain inducing channel may be produced. However, strain inducing channels formed by conventional methods are formed early in semiconductor processing, and may be subject to a series of thermal processing steps which can degrade their crystal structure and hence reduce their charge carrier mobility.

Accordingly, the present disclosure relates to a device and method for strain inducing or high mobility channel replacement in a semiconductor device. A sacrificial layer is formed early in the semiconductor device processing. After one or more thermal processing steps are carried out with the sacrificial layer in place, the sacrificial layer is removed to form a recess. A strain inducing or high mobility layer then fills the recess to insure a robust crystal structure with minimal defects. Strain inducing or high mobility channel replacement may result in better device performance compared to conventional techniques for strain inducing channel formation, and is fully compatible with the current semiconductor manufacturing infrastructure.

FIG. 2 illustrates some embodiments of strained lattices 200 which are used in semiconductor devices due to their relatively high charge carrier mobility. The strained lattices 200 comprise a first lattice 202 composed of species A 204, a second lattice 206 composed of species B 208, and a third lattice 210 composed of species C 212. The periodic spacing of a species within a given lattice is defined as its lattice constant. The first lattice 202 has a lattice constant x 214, the second lattice 206 has a lattice constant y 216, and the third lattice 210 has a lattice constant z 218. Near the interface region 222 of the first lattice 202 and the second lattice 206 a mismatch in lattice constants results in a strain of one or more of the first or second crystal lattices, 202 and 206 respectively. In this embodiment, the second lattice 206 is subject to a compressive strain 224 resulting a mismatch of its lattice constant y with the lattice constant x 214 (i.e., y>x results in compressive 224 strain for the second lattice 206). Similarly, the third lattice 210 is subject to a tensile strain 226 resulting from a mismatch of its lattice constant z with the lattice constant x 214 near the interface 228 (i.e., z<x results in tensile strain 226 for the third lattice 210).

Mechanical strain, thermal effects, and chemical effects are some examples of factors that can result in defects within a lattice. A vacancy 230 results from a particle of species A 204 being absent from its expected periodic location. An Interstitial 232 results from a particle of species A 204 being in a location other than its expected periodic location. A substitution 234 results from a particle of species C 212 residing in a location where a particle of species A 204 is expected (e.g., a contaminant for a single-species lattice). An edge dislocation 236 is where an extra half plane of particles is introduced. A stacking fault 238 occurs when one or more planes of atoms interrupts the normal periodic stacking of particle planes. These defects degrade the crystal structure and hence the charge carrier mobility of these strained lattices. Moreover, as defects accumulate the crystal structure may become so distorted that it becomes amorphous.

To improve the strain within a strain inducing layer when thermal processing steps are used in semiconductor device processing a sacrificial layer may be formed early in the semiconductor device processing. After one or more thermal processing steps are carried out with the sacrificial layer in place, the sacrificial layer is removed to form a recess. A strain inducing or high mobility layer then fills the recess to insure a robust crystal structure with minimal defects.

Figure 3A:
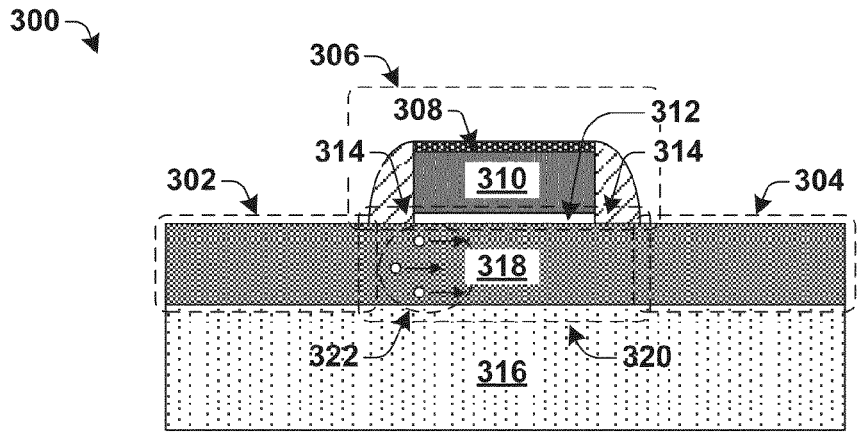
FIG. 3a-FIG. 3c illustrate some embodiments of forming a p-type metal-oxide semiconductor field transistor (p-MOS) transistor with a partial replacement channel.
Figure 3B:
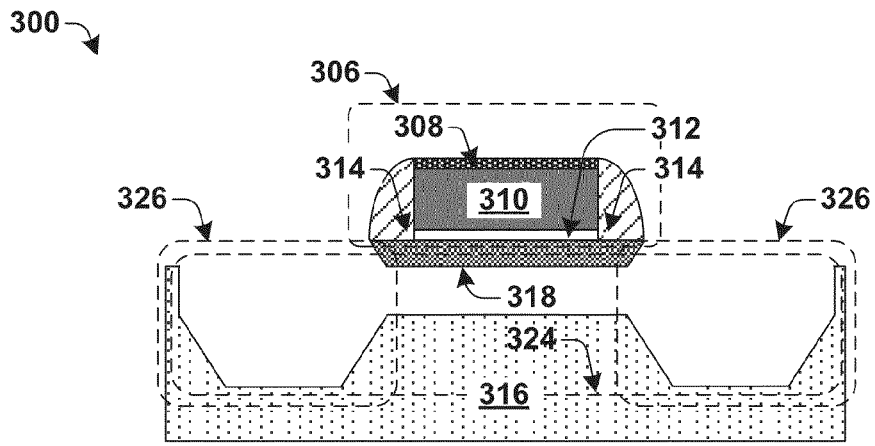
Figure 3C:
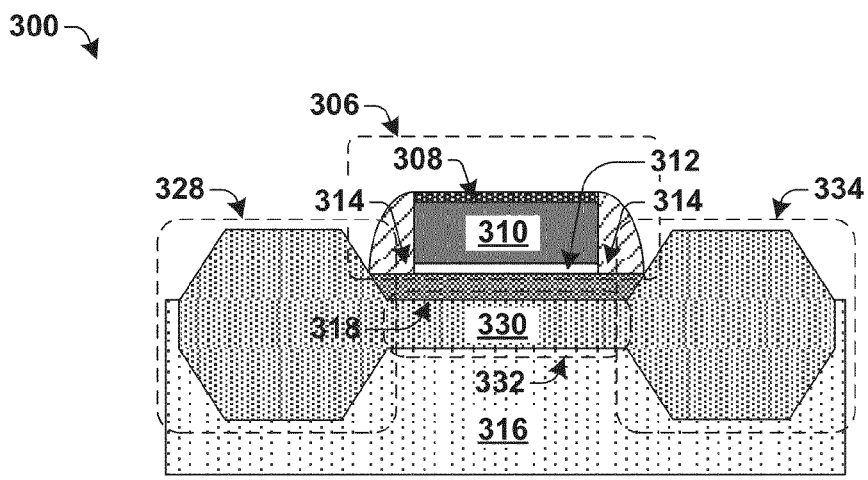

FIG. 3a- FIG. 3c illustrate some embodiments of forming a p-type metal-oxide semiconductor field transistor (p-MOS) transistor with a partial replacement channel. FIG. 3a illustrates p-MOS 300 comprising a gate 306, which overlies a sacrificial layer 318. The gate 306 comprises a hard mask 308, Poly-Silicon gate material (Poly-Si) 310, a gate dielectric 312, and sidewall spacers 314 to insure electrical isolation of the gate 306 from the source 302 and drain 304. The p-MOS 300 is situated on a Si substrate 316 (i.e., Si lattice) to which the sacrificial layer of Si or SiGe 318 has been added (i.e., SiGex where x≥0.2). The sacrificial layer of Si or SiGe 318 includes sacrificial source and drain regions 302, 304, which are arranged on opposite edges of gate 306, and also includes a sacrificial channel region 320 aligned under the gate 306. The mismatch in lattice constants between the Si substrate 316 and sacrificial layer of Si or SiGe 318 results in a compressive strain within the sacrificial channel region 320 of the p-MOS 300 along the channel width direction, having the effect of increasing the hole charge carrier 322 mobility by approximately 1.4-1.8 times that of bulk devices (i.e., Si).

The hole charge carrier 322 mobility, however, will be degraded by thermal processing steps that occur after the formation of the sacrificial layer of Si or SiGe 318, due to the distortion its lattice structure of the sacrificial layer of Si or SiGe 318. FIG. 3b illustrates the p-MOS 300 wherein the sacrificial layer of Si or SiGe 318 has been etched away from the sacrificial source region 302, the sacrificial drain region 304, and the sacrificial channel region 320 (e.g., a wet chemical etch, a dry chemical etch, or a combination thereof) to form a recess 324 after the thermal processing steps are complete. At the same time (i.e., as a part of the same etch step) a strained source drain (SSD) etch forms larger etch profile regions 326 within the recess 324. Note that a portion of the sacrificial layer of Si or SiGe 318 approximately 1-50nm thick remains below the gate 306, and shields the gate 306 from any undesired effects from removing the sacrificial layer of Si or SiGe 318 (e.g., damage and/or contamination to the gate 306).

FIG. 3c illustrates the p-MOS 300 wherein the recess 324 has been filled with a single strain inducing or high mobility layer 330 (i.e., single lattice) comprising SiGex (where x≥0.2) or Ge with a gradient concentration, either doped or undoped, with a cap formed from the sacrificial layer of Si or SiGe 318 that remains below the gate 306 and above a replacement channel region 332. This partial replacement channel region 332 separates replacement source and drain regions 328, 334 formed within the strain inducing or high mobility layer 330. In some embodiments, the replacement channel region 332, replacement source region 328 and replacement drain region 334 comprise a single crystal. While formation of a partial replacement channel region 332 has the benefit of protecting the gate 306, it results in less overall strain and hence less hole mobility than a full replacement channel region. Nonetheless, because the partial replacement channel 332 region comprises a strain induced layer formed after thermal processing, it has an increased induced-strain relative to conventional devices.

A strain inducing channel on an n-type metal-oxide semiconductor field transistor (n-MOS) can be achieved by the same means as described in the embodiments of the p-MOS 300 wherein a composite layer of strained Si on strained SiGe (e.g., Si/SiGe$_{0.2}$) fills the recess 324 instead of the strain inducing or high mobility layer 330. The mismatch in lattice constants between the composite layer of strained Si on strained SiGe and the substrate 314 results in a tensile strain of the n-MOS along the channel width direction, having the effect of increasing the electron charge carrier mobility by approximately 1.25-2 times that of bulk devices.

Figure 4A:
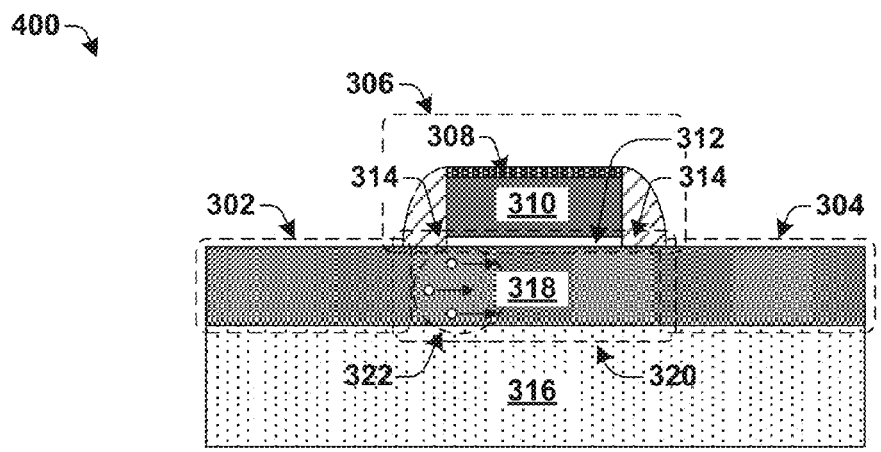
FIG. 4a-FIG. 4c illustrate some embodiments of forming a p-type metal-oxide semiconductor field transistor (p-MOS) transistor with a full replacement channel.
Figure 4B:
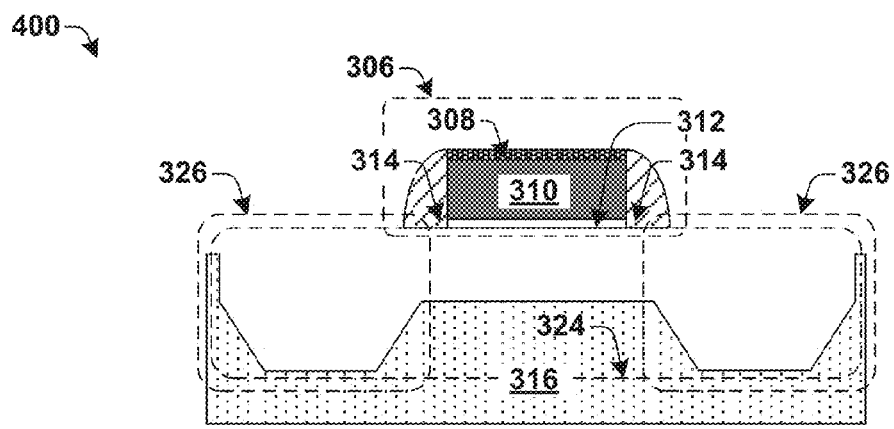
Figure 4C:
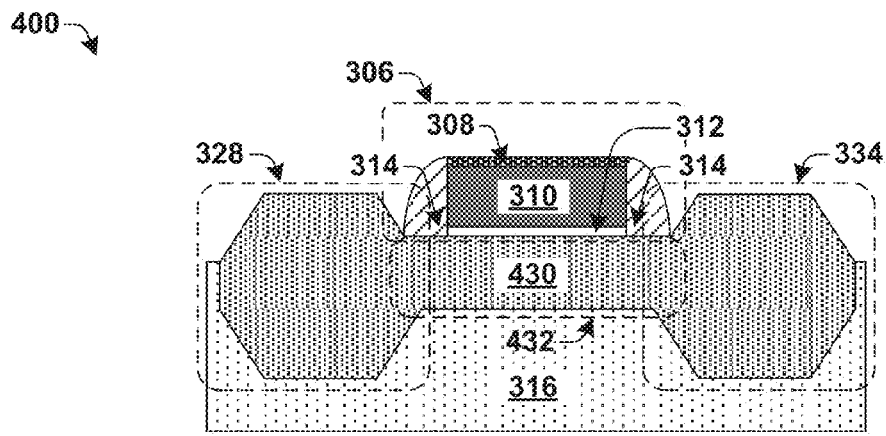

FIG. 4a-FIG. 4c illustrate some embodiments of forming a p-type metal-oxide semiconductor field transistor (p-MOS) transistor with a full replacement channel region. The formation of a full replacement channel region illustrated for a p-MOS 400 in FIG. 4a-4c is similar to the formation of the partial replacement channel region described in the embodiments of FIG. 3a-FIG. 3c. However, for the formation of a full replacement channel region, no portion of the sacrificial layer of Si or SiGe 318 remains such that the recess 324 abuts the bottom of the gate dielectric 312. The recess 324 is then filled with a single strain inducing or high mobility layer 430 (i.e., single lattice) comprising SiGex (where x≥0.2) or Ge with a gradient concentration, and is either doped or undoped. Note that no cap is formed since the sacrificial layer of Si or SiGe 318 has been completely removed. The strain inducing or high mobility layer 430 forms the replacement source and drain, regions 328, 334, and a full replacement channel region 432, which results in more overall strain than the partial replacement channel region 332 of the embodiments of FIGS. 3A-3C, and hence an increased hole mobility relative to the partial replacement channel region 332.

FIG. 5a illustrates some embodiments of forming a partial replacement channel on planar FETs 500a. Note that the cross-section shown for this embodiment is rotated 90 degrees from the embodiments of FIG. 3 and FIG. 4 such that the channel length direction faces out of the page. The planar FETs 500a comprise a gate 502a, and Si or SiGex channels 504a which are isolated from one another by a shallow trench isolation oxide (STI OX) 506a. Each original channel of Si or SiGe is etched away (e.g., a wet chemical etch, a dry chemical etch, or a combination thereof) to form a recess 508a, leaving a portion of the Si or SiGe channel 510a approximately 1-50 nm thick below the gate 502a. A strain inducing layer or high mobility layer 512a of SiGex (where x≥0.2) or Ge is then re-grown within the recess 508a (e.g., epitaxial growth). This method results in the formation of a partial replacement channel on the planar FETs 500a.

FIG. 5b illustrates some embodiments of forming a partial replacement channel on finFETs 500b, which is identical to the embodiments of forming a partial replacement channel on planar FETs 500a with the distinction that the Si or SiGex channels 504b extend into the gate 502b to form "fins" 507b that are wrapped in by the gate 502b on three sides. Each Si or SiGex channel 504b is etched away to form a recess 508b with a portion of the Si or SiGe channel 510b approximately 1-50 nm thick remaining at the top of the original channel 504b. A strain inducing layer or high mobility layer 512b of SiGex (where x≥0.2) or Ge is then re-grown within the recess 508b. This method results in the formation of a partial replacement channel on the finFETs 500b.

FIG. 6a illustrates some embodiments of forming a full replacement channel on planar FETs 600a, which comprise a gate 602a, and Si or SiGex channels 604a which are isolated from one another by a shallow trench isolation oxide (STI OX) 606a. Each original channel of Si or SiGe is etched away to form a recess 608a such that no portion of the Si or SiGe channel 604a resides between the recess 608a and the gate 602a (i.e., the recess abuts the bottom of the gate). A strain inducing layer or high mobility layer 610a of SiGex (where x≥0.2) or Ge is then re-grown within the recess 608a. This method results in the formation of a full replacement channel on the planar FETs 600a.

FIG. 6b illustrates some embodiments of forming a full replacement channel on finFETs 600b. The distinction between the embodiments of 600a and 600b is similar to the distinction between the embodiments of 500a and 500b, wherein the only difference is that the Si or SiGex channels 604b extend into the gate 602b to form "fins" 607b that are wrapped in by the gate 602b on three sides. Each Si or SiGe channel is etched away to form a recess 608b which abuts the bottom of the gate 602b. A strain inducing layer or high mobility layer 610b of SiGex (where x≥0.2) or Ge is then re-grown within the recess 608b to form a full replacement channel on the finFETs 600b.

FIG. 7a-FIG. 7e illustrate some detailed embodiments of forming a channel-last replacement channel on a planar FET 700 in a Hi-K metal gate last (HKL) flow. In the Hi-K metal gate last flow a dummy poly gate and dummy liner (IL) are formed early in the semiconductor device processing and then replaced with a real gate late in the processing. In contrast, a Hi-K metal gate first (HKF) flow forms the real gate early in the processing.

Figure 7A:
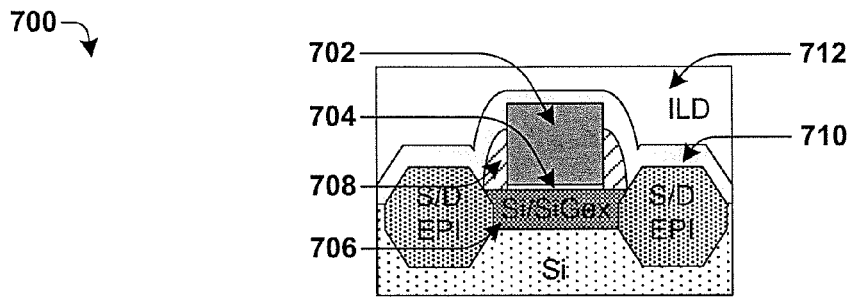
FIG. 7a-FIG. 7e illustrate some detailed embodiments of forming a channel-last replacement channel on a planar FET in a Hi-K metal gate last (HKL) flow.
Figure 7B:
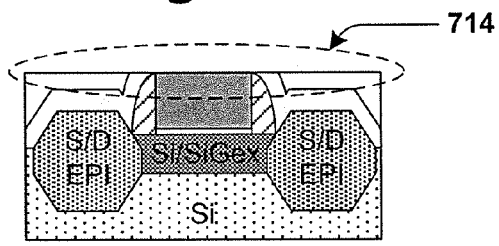
Figure 7C:
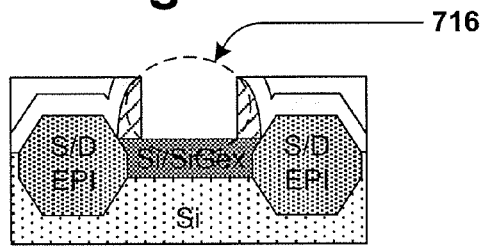
Figure 7D:
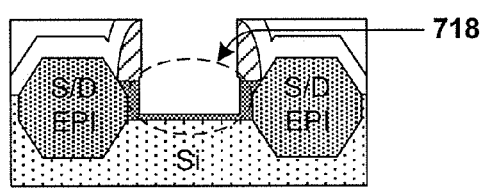
Figure 7E:
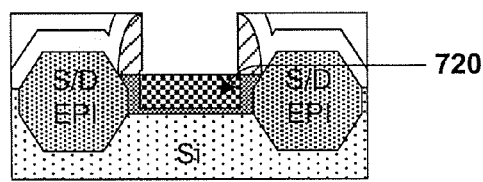

FIG. 7a illustrates a cross-sectional view of a planar FET 700 comprising a dummy gate 702, a dummy liner (IL) 704, a Si or SiGex (where x≥0.2) channel 706, a spacer 708, and a contact etch stop layer 710 formed between the dummy gate 702 and spacer 708 and an interlayer dielectric (ILD) 712. FIG. 7b illustrates a cross-sectional view of the planar FET 700 wherein a chemical-mechanical polish (CMP) 714 has removed the contact etch stop layer 710 and ILD 712 to expose the top of the dummy gate 702. FIG. 7c illustrates a cross-sectional view of the planar FET 700 wherein the dummy gate 702 and a dummy IL 704 have been etched away to form a first recess 716. FIG. 7d illustrates a cross-sectional view of the planar FET 700 wherein the Si or SiGex channel 706 has been etched away to form a second recess 718. FIG. 7e illustrates a cross-sectional view of the planar FET 700 wherein a strain inducing layer or high mobility layer 720 of SiGex (where x≥0.2) or Ge is re-grown within the second recess 718 to form a channel-last replacement channel.

FIG. 8a-FIG. 8d illustrate some embodiments of forming a channel-last replacement channel on planar FETs 800 in a Hi-K metal gate last (HKL) flow. FIG. 8a illustrates a cross-sectional view of the planar FETs 800, which comprise a dummy gate 802, and Si or SiGex channels 804 which are isolated from one another by a shallow trench isolation oxide (STI OX) 806. FIG. 8b illustrates a cross-sectional view of the planar FET 800 wherein the dummy gate 802 has been etched away. FIG. 8c illustrates a cross-sectional view of the planar FET 800 wherein each original Si or SiGe channel 804 is etched away to form a recess 808. FIG. 8d illustrates a cross-sectional view of the planar FET 800 wherein a strain inducing layer or high mobility layer 810 of SiGex (where x≥0.2) or Ge is then re-grown within the recess 808 to form a channel-last replacement channel.

FIG. 9a-FIG. 9d illustrate some embodiments of forming a channel-last replacement channel on finFETs 900 in a Hi-K metal gate last (HKL) flow. The distinction between the embodiments of FIG. 8a-FIG. 8d and FIG. 9a-FIG. 9d is similar to the distinction between the previous embodiments of 600a and 600b wherein the only difference is that the Si or SiGex channels 904 extend into the gate dummy gate 902 to form "fins" 908 as illustrated in a cross-sectional view in FIG. 9a. FIG. 9b illustrates a cross-sectional view of the finFET 900 wherein the dummy gate 902 has been etched away to expose the Si or SiGex "fins" 908. FIG. 9c illustrates a cross-sectional view of the planar FET 900 wherein each original Si or SiGe channel 904 is etched away to form a recess 910. FIG. 9d illustrates a cross-sectional view of the planar FET 900 wherein a strain inducing layer or high mobility layer 912 of SiGex (where x≥0.2) or Ge is then re-grown within the recess 910 to form a channel-last replacement channel.

FIG. 10a-FIG. 10e illustrate cross-sectional views of some embodiments of typical SSD etch profiles. FIG. 10a illustrates a cross-sectional view of some embodiments 1000a of a sigma-shape etch profile 1002a for a strained source drain (SSD) etch. FIG. 10b illustrates a cross-sectional view of some embodiments 1000b of a sigma-shape etch profile 1002b for a strained source drain (SSD) etch. FIG. 10c illustrates a cross-sectional view of some embodiments 1000c of an anisotropic etch profile 1002c for a strained source drain (SSD) etch. FIG. 10d illustrates a cross-sectional view of some embodiments 1000d of an isotropic etch profile 1002d for a strained source drain (SSD) etch. FIG. 10e illustrates a cross-sectional view of some embodiments 1000e of a triangular etch profile 1002e for a strained source drain (SSD) etch.

Figure 11:
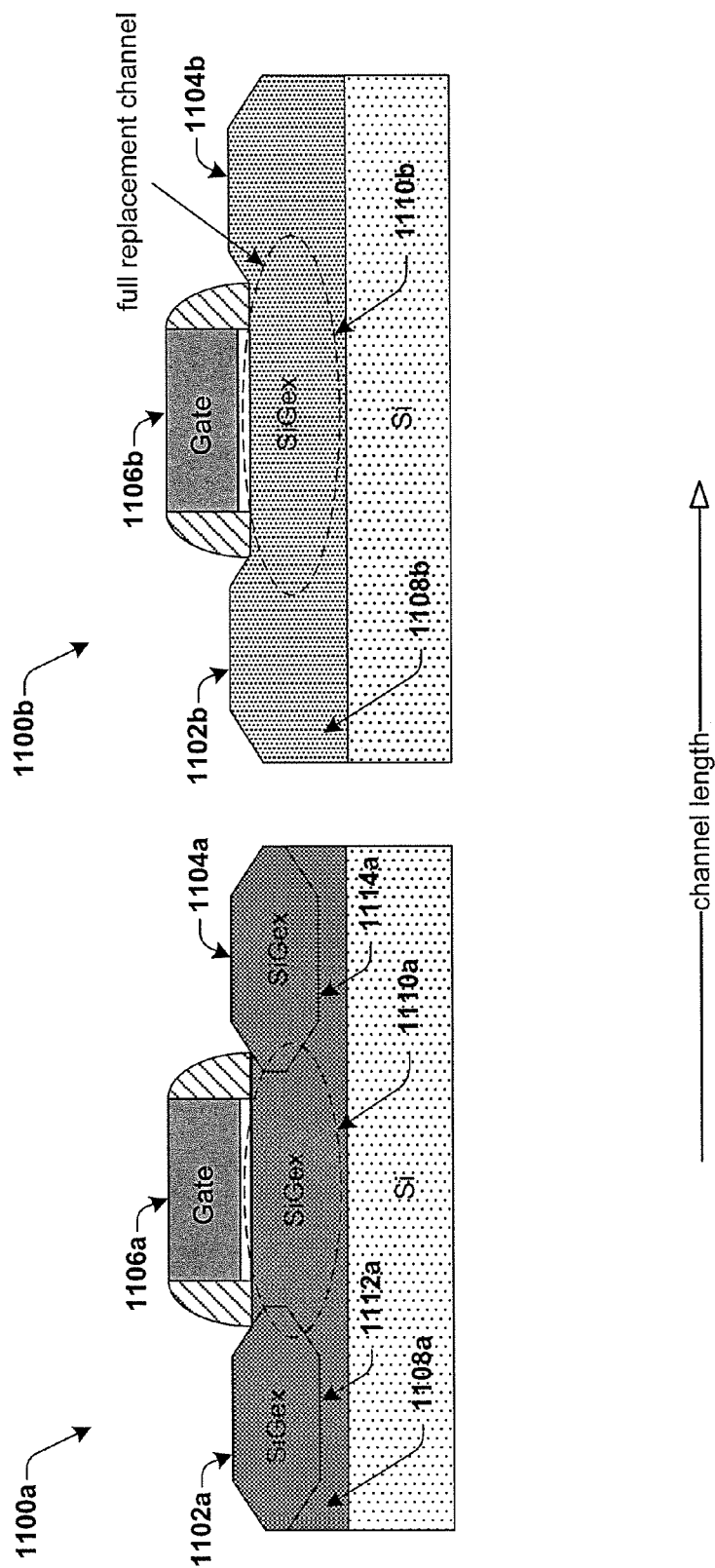
FIG. 11 illustrates a comparison of some embodiments of a p-MOS formed by conventional strain inducing channel methods vs. a p-MOS formed by a full replacement channel method.

FIG. 11 illustrates a comparison of some embodiments of a p-MOS 1100a formed by conventional strain inducing channel methods vs. a p-MOS 1100b formed by a full replacement channel method. The p-MOS 1100a formed by a conventional methods comprises a source 1102a and drain 1104a comprising first and second strained EPI layers of SiGe, respectively. The p-MOS 1100a further comprises gate 1106a, and a third strained layer of SiGe 1108 that forms a channel region 1110a. A first boundary 1112a separates the first strained EPI layer of SiGe of the source 1102a from the third strained layer of SiGe 1108. A second boundary 1114a separates the second strained EPI layer of SiGe of the drain 1104a from the third strained layer of SiGe 1108. The shape of the first and second boundaries 1112a and 1114a is determined by the type of strained source drain (SSD) etch used to form the source 1102a and drain 1104a, and may comprise a sigma-shape profile (shown), an anisotropic etch profile, or an isotropic etch profile. The p-MOS 1100b also comprises a source 1102b, a drain 1104b, and a gate 1106b. However, the p-MOS 1100b comprises only a single layer of SiGe 1108b (i.e., single lattice) that forms the source 1102b, drain 1104b, as well as a full replacement channel 1110b.

Figure 12:
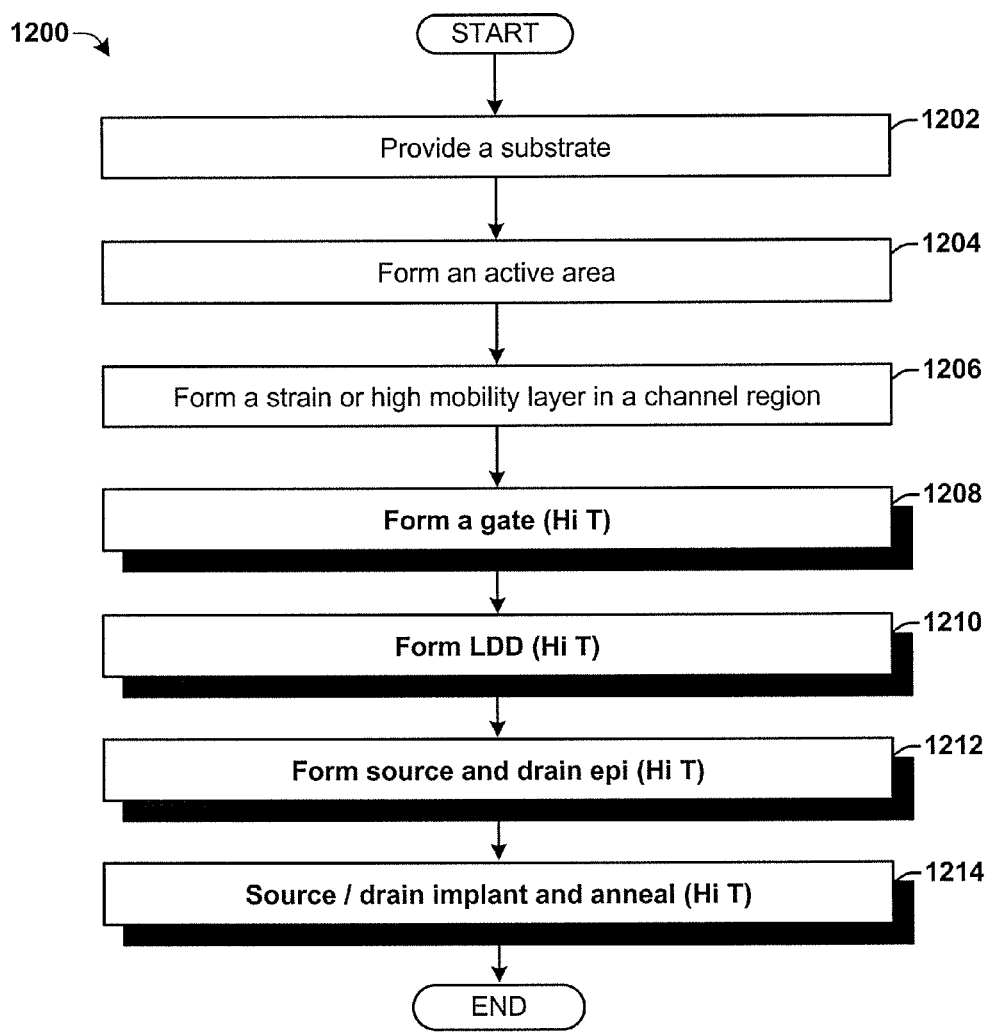
FIG. 12 illustrates a flow diagram of some embodiments of a conventional method for manufacturing a strain inducing or high mobility channel.

FIG. 12 illustrates a flow diagram of some embodiments of a conventional method 1200 for manufacturing a strain inducing or high mobility channel. Note that the method 1200 is applicable in both the Hi-K metal gate last (HKL) flow as well as the Hi-K metal gate first (HKF) flow. While method 1200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 1202 a substrate is provided. The substrate may comprise a 300 mm or 450 mm crystalline wafer comprising silicon that has been doped with boron, phosphorus, arsenic, or antimony.

At step 1204 an active area is formed, which may comprise doping of the substrate.

At step 1206 a strain or high mobility layer is formed in a channel region within the active area.

At step 1208 a gate is formed. The gate may comprise a layer of Poly-Silicon above a layer of gate dielectric, and subjects the substrate to thermal processing (Hi T).

At step 1210 a lightly-doped drain (LDD) is formed to improve charge carrier movement from the source to the drain. Formation of the LDD subjects the substrate to thermal processing (Hi T). The thermal processing may comprise a plurality of high temperature anneals, a plurality of high temperature process steps, or a combination thereof.

At step 1212 a source and drain epi layer is formed. The source and drain epi layer may comprise a layer of epitaxial SiGe for a p-MOS (e.g., $SiGe_{0.3}$), or a composite layer of epitaxial Si on layer of epitaxial SiGe for an n-MOS (e.g., $Si/SiGe_{0.2}$). Formation of the source and drain epi layer subjects the substrate to thermal processing (Hi T). The thermal processing may comprise a plurality of high temperature anneals, a plurality of high temperature process steps, or a combination thereof.

At step 1214 a source and drain implant and anneal is performed. The source and drain implant may comprise an ion implantation of arsenic to improve threshold voltage, and subjects the substrate to thermal cycling (Hi T). The thermal processing may comprise a plurality of high temperature anneals, a plurality of high temperature process steps, or a combination thereof.

Figure 13:
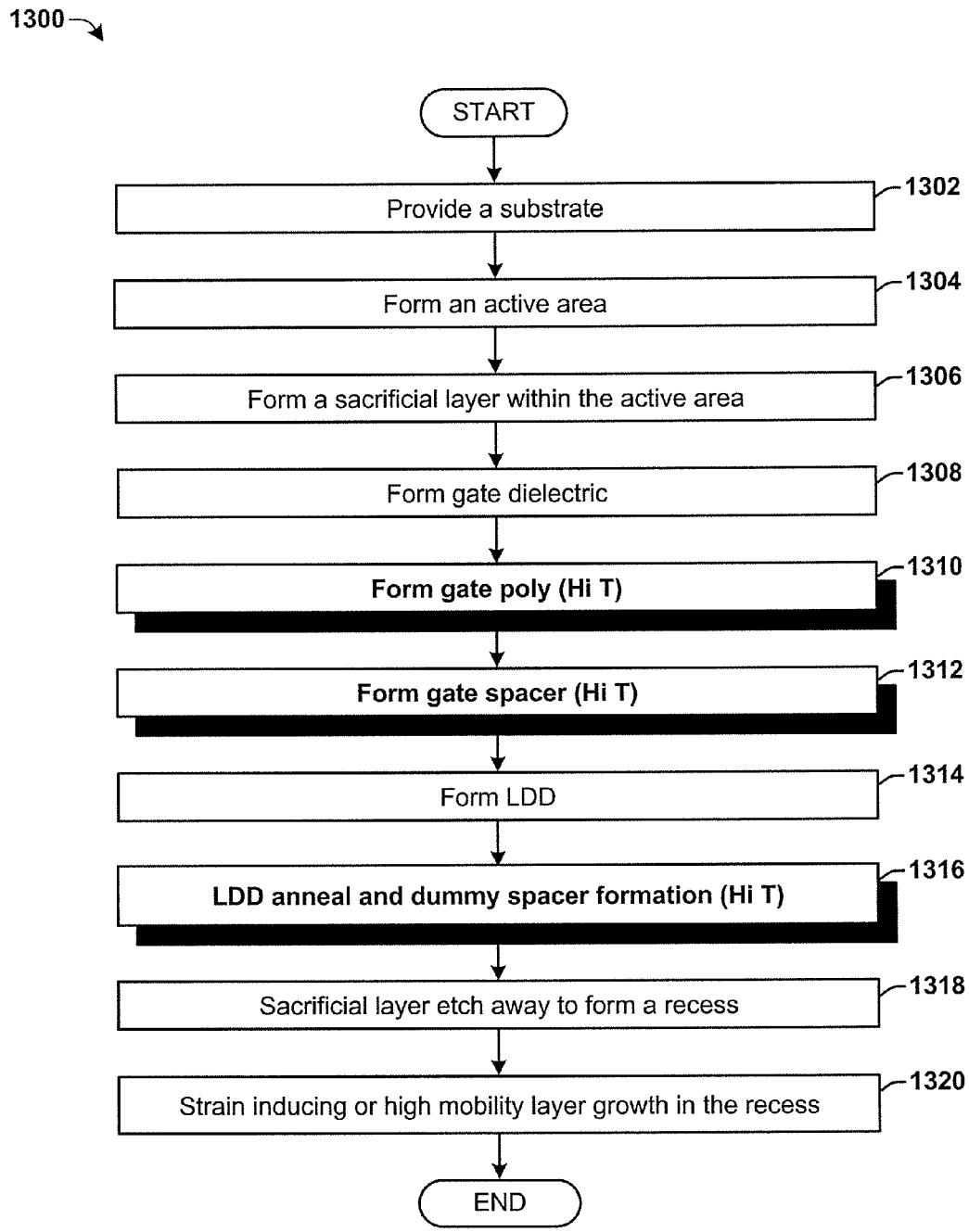
FIG. 13 illustrates a flow diagram of some embodiments of a method for manufacturing a replacement channel that can be used for both a partial replacement channel and a full replacement channel.

FIG. 13 illustrates a flow diagram of some embodiments of a method 1300 for manufacturing a replacement channel that can be used for both a partial replacement channel and a full replacement channel. Note that the method 1300 is applicable in both the Hi-K metal gate last (HKL) flow as well as the Hi-K metal gate first (HKF) flow. While method 1300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 1302 a substrate is provided. The substrate may comprise a 300 mm or 450 mm crystalline wafer comprising silicon that has been doped with boron, phosphorus, arsenic, or antimony.

At step 1304 an active area is formed, which may comprise doping of the substrate.

At step 1306 a sacrificial layer is formed in a channel region within the active area. The sacrificial layer may comprise a layer of epitaxial SiGe for a p-MOS (e.g., $SiGe_{0.3}$), or a composite layer of epitaxial Si on layer of epitaxial SiGe for an n-MOS (e.g., $Si/SiGe_{0.2}$).

At step 1308 a gate dielectric is formed, which may comprise $SiO_2$ or a Hi-K dielectric to reduce power loss due to gate current leakage into the channel region.

At step 1310 a gate material is formed. The gate may comprise a layer of Poly-Silicon or metal above the layer of gate dielectric and subjects the substrate to thermal cycling (Hi T).

At step 1312 a gate spacer is formed, which may comprise a dielectric sidewall spacer to insure electrical isolation of the gate poly.

At step 1314 a lightly-doped drain (LDD) is formed to improve charge carrier movement within the channel region.

At step 1316 a LDD anneal is performed to further improve charge carrier movement through the channel region. At the same time a dummy spacer is formed. Both processes subject the substrate to thermal cycling (Hi T).

At step 1318 the sacrificial layer is removed to form a recess by a wet chemical etch, a dry chemical etch, or a combination thereof, that utilizes an isotropic etch profile.

At step 1320 a strain inducing layer or high mobility layer is formed in the recess. The strain inducing layer or high mobility layer may comprise a layer of epitaxial SiGe for a p-MOS (e.g., $SiGe_{0.3}$), a gradient concentration layer (e.g., Ge), a doped layer (e.g., Boron or Phosphorus), a composite layer of epitaxial Si on layer of epitaxial SiGe for an n-MOS (e.g., $Si/SiGe_{0.2}$), or any combination thereof.

Figure 14:
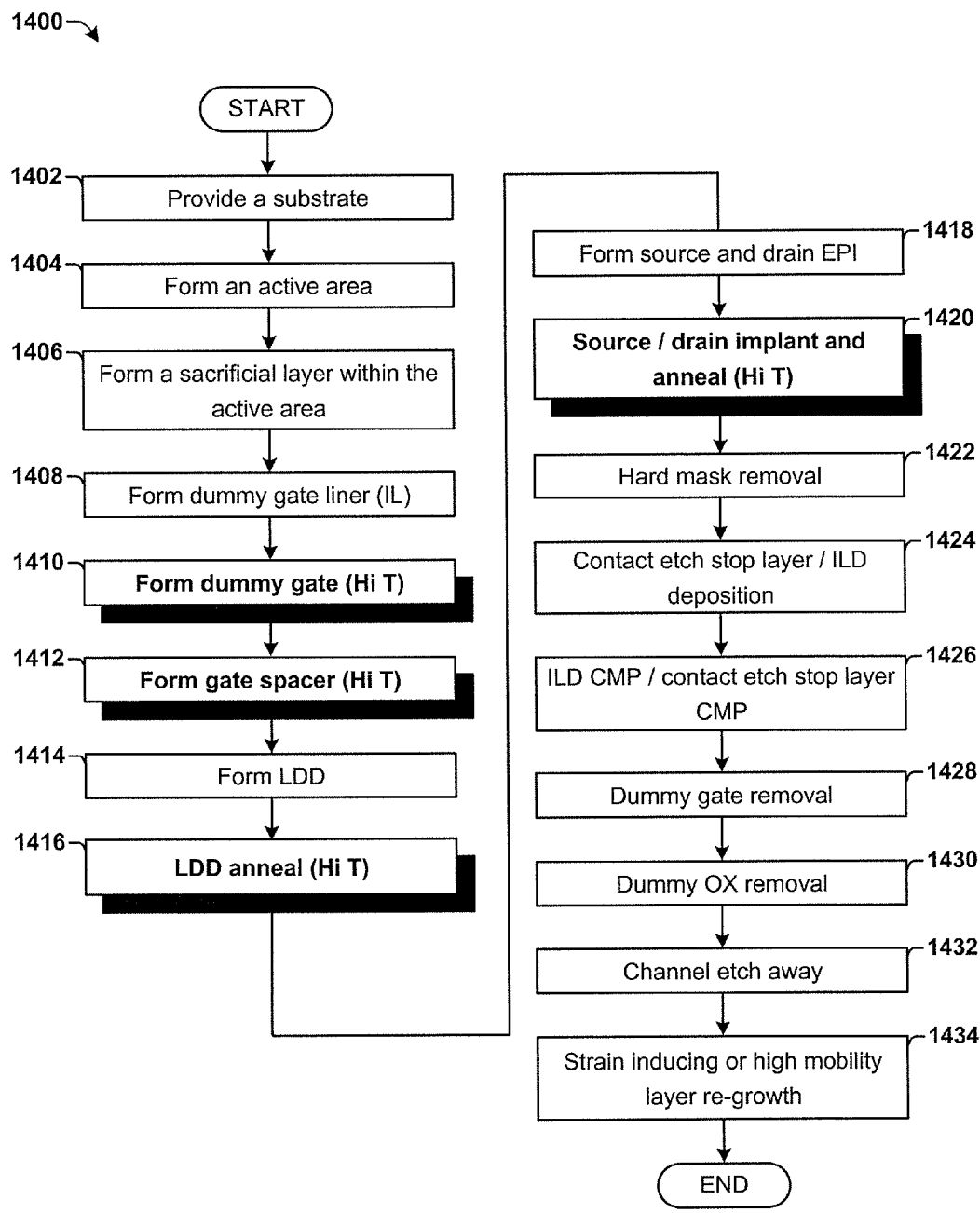
FIG. 14 illustrates a flow diagram of some embodiments of a method for manufacturing a channel-last replacement channel.

FIG. 14 illustrates a flow diagram of some embodiments of a method 1400 for manufacturing a channel-last replacement channel. Note that the method 1400 is applicable only in the Hi-K metal gate last (HKL) flow. While method 1400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 1402 a substrate is provided. The substrate may comprise a 300 mm or 450 mm crystalline wafer comprising silicon that has been doped with boron, phosphorus, arsenic, or antimony.

At step 1404 an active area is formed, which may comprise doping of the substrate.

At step 1406 a sacrificial layer is formed in a channel region within the active area. The sacrificial layer may comprise a layer of epitaxial SiGe for a p-MOS (e.g., $SiGe_{0.3}$), or a composite layer of epitaxial Si on layer of epitaxial SiGe for an n-MOS (e.g., $Si/SiGe_{0.2}$).

At step 1408 a dummy gate liner (IL) is formed.

At step 1410 a dummy gate material is formed. The dummy gate may comprise a layer of dummy oxide beneath a dummy gate material (e.g., Poly-Silicon). The dummy gate is capped by a hard mask. The formation of the dummy gate subjects the substrate to thermal cycling (Hi T).

At step 1412 a gate spacer is formed, which may comprise a dielectric sidewall spacer to insure electrical isolation of the gate poly.

At step 1414 a lightly-doped drain (LDD) is formed to improve charge carrier movement within the channel region.

At step 1416 a LDD anneal is performed to further improve charge carrier movement within the channel region. The LDD anneal subjects the substrate to thermal cycling (Hi T).

At step 1418 a source and drain epi layer is formed. The source and drain epi layer may comprise a layer of epitaxial SiGe for a p-MOS (e.g., $SiGe_{0.3}$), or a composite layer of epitaxial Si on layer of epitaxial SiGe for an n-MOS (e.g., $Si/SiGe_{0.2}$).

At step 1420 a source and drain implant and anneal is performed. The source and drain implant may comprise an ion implantation of arsenic to improve threshold voltage. The anneal subjects the substrate to thermal cycling (Hi T).

At step 1422 the hard mask is removed from above the gate, which may comprise a wet chemical etch, a dry chemical etch, or a combination thereof.

At step 1424 a contact etch stop layer is added above the gate, spacer, source, and drain. An interlayer dielectric (ILD) is added above the etch stop layer.

At step 1426 the contact etch stop layer and ILD are subjected to a chemical-mechanical polish (CMP) to expose the top of the dummy gate material.

At step 1428 the dummy gate material is removed, which may comprise a wet chemical etch, a dry chemical etch, or a combination thereof.

At step 1430 the dummy oxide is removed, which may comprise a wet chemical etch, a dry chemical etch, or a combination thereof.

At step 1432 the channel region is removed to form a recess. The removal of the channel region may comprise wet chemical etch, a dry chemical etch, or a combination thereof, that utilizes an isotropic etch profile, and anisotropic etch profile, a sigma-shape etch profile, or a triangular etch profile.

At step 1434 a strain inducing layer or high mobility layer is formed in the recess. The second strain inducing layer or high mobility layer may comprise a layer of epitaxial SiGe for a p-MOS (e.g., $SiGe_{0.3}$), a gradient concentration layer (e.g., Ge), a doped layer (e.g., Boron or Phosphorus), a composite layer of epitaxial Si on layer of epitaxial SiGe for an n-MOS (e.g., $Si/SiGe_{0.2}$), or any combination thereof.

Figure 15A:
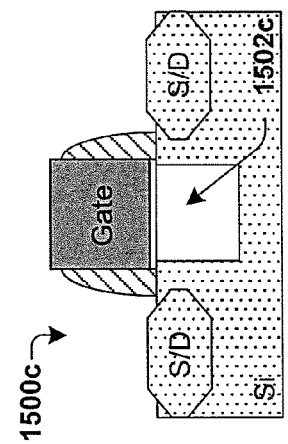
FIG. 15a-FIG. 15f illustrate cross-sectional views of some embodiments of channel-last replacement channel profiles.
Figure 15B:
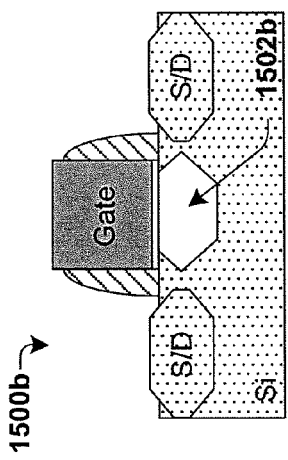
Figure 15C:
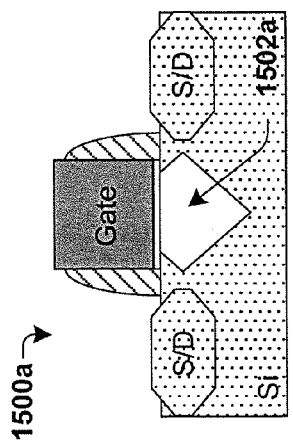
Figure 15D:
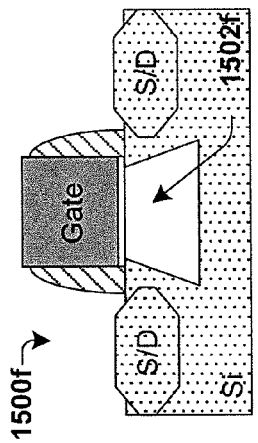
Figure 15E:
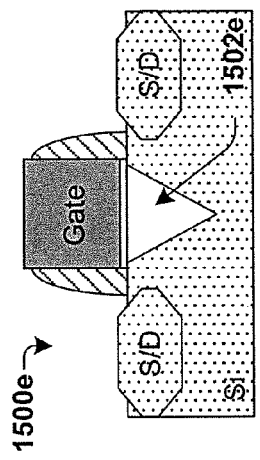
Figure 15F:
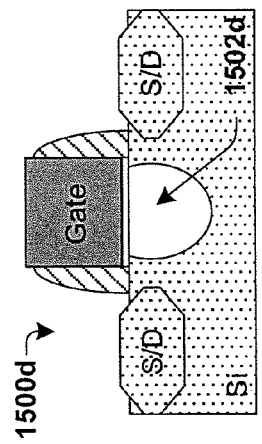

FIG. 15*a*-FIG. 15*f* illustrate cross-sectional views of some embodiments of channel-last replacement channel profiles. FIG. 15*a* illustrates a cross-sectional view of some embodiments 1500*a* of a sigma-shape profile 1502*a* for a channel-last replacement channel. FIG. 15*b* illustrates a cross-sectional view of some embodiments 1500*b* of a sigma-shape profile 1502*b* for a channel-last replacement channel. FIG. 15*c* illustrates a cross-sectional view of some embodiments 1500*c* of an anisotropic profile 1502*c* for a channel-last replacement channel. FIG. 15*d* illustrates a cross-sectional view of some embodiments 1500*d* of an isotropic profile 1502*d* for a channel-last replacement channel. FIG. 15*e* illustrates a cross-sectional view of some embodiments 1500*e* of a triangular profile 1502*e* for a channel-last replacement channel. FIG. 15*f* illustrates a cross-sectional view of some embodiments 1500*f* of a trapezoidal profile 1502*f* for a channel-last replacement channel.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a device and method for strain inducing or high mobility channel replacement in a semiconductor device. The semiconductor device is configured to control current from a source to a drain through a channel region by use of a gate. A sacrificial layer is formed early in the semiconductor device processing. After one or more thermal processing steps are carried out with the sacrificial layer in place, the sacrificial layer is removed to form a recess. A strain inducing or high mobility layer then fills the recess to insure a robust crystal structure with minimal defects. Strain inducing or high mobility channel replacement may result in better device performance compared to conventional techniques for strain inducing channel formation, and is fully compatible with the current semiconductor manufacturing infrastructure.

In some embodiments, the strain inducing or high mobility channel replacement comprises a partial replacement channel on a field effect transistor (FET), wherein a sacrificial layer forming a source, drain, and channel region are removed after a series of thermal processing steps to form a recess. The recess is then with a strain inducing or high mobility layer. These embodiments comprise a partially removing the sacrificial layer such that a portion of the sacrificial layer remains immediately below the gate. This results in a partial replacement channel that is a combination of the sacrificial layer and the strain inducing or high mobility layer.

In some embodiments, the strain inducing channel replacement comprises a full replacement channel on a field effect transistor (FET), wherein a sacrificial layer forming a source, drain, and channel region are removed after a series of thermal processing steps to form a recess. The recess is then with a strain inducing or high mobility layer. These embodiments comprise a fully removing the sacrificial layer such that none of the sacrificial layer remains above the source, drain, and channel region. This results in a full replacement channel comprising only the strain inducing or high mobility layer.

In some embodiments the present disclosure relates to a method for strain inducing or high mobility channel replacement comprising partially replacing a channel on a field effect transistor (FET), wherein a sacrificial layer forms a source, drain, and channel region. After a series of thermal processing steps are performed, the sacrificial layer is removed to form a recess. The recess is then filled with a strain inducing or high mobility layer. In the method of these embodiments the sacrificial layer is partially removed such that a portion of the sacrificial layer remains immediately below the gate. The removed portion of the sacrificial layer is then replaced with a strain inducing or high mobility layer such that the replacement channel is a combination of the sacrificial layer and the strain inducing or high mobility layer.

In some embodiments the present disclosure relates to a method for strain inducing channel replacement comprising fully replacing a channel on a field effect transistor (FET), wherein a sacrificial layer forms a source, drain, and channel region. After a series of thermal processing steps are performed, the sacrificial layer is removed to form a recess. The recess is then filled with a strain inducing or high mobility layer. In the method of these embodiments the sacrificial layer is fully removed such that none of the sacrificial layer remains above the source, drain, and channel region. The removed sacrificial layer is then replaced with a strain inducing or high mobility layer such that the replacement channel comprises only the strain inducing or high mobility layer.

What is claimed is:

1. A method for fabricating a semiconductor device, comprising:

providing a substrate;

forming a sacrificial layer over the substrate, wherein the sacrificial layer comprises a different lattice structure than the substrate;

forming a gate over the sacrificial layer, wherein a sacrificial channel region is arranged under the gate in the sacrificial layer and wherein sacrificial source/drain regions are arranged on opposite edges of the gate in the sacrificial layer;

removing at least a portion of the sacrificial source, sacrificial drain, and sacrificial channel regions concurrently to form a recess within the substrate; and forming a strain inducing or high mobility layer in the recess, wherein the strain inducing or high mobility layer comprises a replacement source region, a replacement drain region, and a replacement channel region formed in place of the sacrificial source region, sacrificial drain region, and sacrificial channel region, respectively, and wherein the strain inducing or high mobility layer is configured to provide increased charge carrier mobility in the replacement channel region relative to the sacrificial channel region.

2. The method of claim 1, wherein the recess spans a region continuously under the gate.

3. The method of claim 1, wherein an unremoved portion of the sacrificial layer remains above the recess and immediately below the gate dielectric after removing the sacrificial source region, sacrificial drain region, and sacrificial channel region.

4. The method of claim 1, wherein the sacrificial layer is fully removed such that a gate dielectric abuts the recess after removing the sacrificial source region, sacrificial drain region, and sacrificial channel region.

5. The method of claim 1, wherein the gate is removed from above the sacrificial channel region prior to the forming the strain inducing or high mobility layer in the recess.

6. The method of claim 1, wherein the sacrificial layer is removed after one or more thermal processing steps have been performed with the sacrificial layer in place.

7. The method of claim 1, wherein the strain inducing or high mobility layer is formed epitaxially on the substrate.

8. The method of claim 1, wherein the sacrificial layer or the strain inducing or high mobility layer comprises SiGe, Ge, or Si on SiGe.

9. A method for fabricating a semiconductor device, comprising:

providing a substrate;

forming a sacrificial layer over the substrate, wherein the sacrificial layer comprises a different lattice structure than the substrate;

forming a gate over the sacrificial layer, wherein a sacrificial channel region is arranged under the gate in the sacrificial layer and wherein sacrificial source/drain regions are arranged on opposite edges of the gate in the sacrificial layer;

subjecting the substrate to thermal cycling while the sacrificial layer is in place;

after thermal cycling, removing at least a portion of the sacrificial source region, sacrificial drain region, and sacrificial channel region concurrently to form a recess within the substrate; and forming a strain inducing or high mobility layer in the recess, wherein the strain inducing or high mobility layer comprises a replacement source region, a replacement drain region, and a replacement channel region formed in place of the sacrificial source region, sacrificial drain region, and sacrificial channel region, respectively.

10. The method of claim 9, wherein an unremoved portion of the sacrificial layer remains above the recess and immediately below the gate dielectric after removing the sacrificial source region, sacrificial drain region, and sacrificial channel region.

11. The method of claim 9, wherein the sacrificial layer is fully removed such that a gate dielectric abuts the recess after removing the sacrificial source region, sacrificial drain region, and sacrificial channel region.

12. The method of claim 9, wherein the gate is removed from above the sacrificial channel region prior to the forming the strain inducing or high mobility layer in the recess.

13. The method of claim 9, wherein removing the sacrificial layer comprises performing a wet chemical etch, a dry chemical etch, or a combination thereof, after one or more thermal processing steps have been performed with the sacrificial layer in place, and wherein the thermal cycling degrades a crystal structure of the sacrificial layer.

14. The method of claim 9, wherein the strain inducing or high mobility layer is formed epitaxially on the substrate.

15. The method of claim 9, wherein the sacrificial layer or the strain inducing or high mobility layer comprises SiGe, Ge, or Si on SiGe.

16. A semiconductor device, comprising:

a continuous strain inducing or high mobility layer formed within a substrate and configured to provide increased charge carrier mobility relative to the substrate;

a source region formed in the strain inducing or high mobility layer that emits charge carriers;

a drain region formed in the strain inducing or high mobility layer that receives charge carriers from the source region;

a channel region formed in the strain inducing or high mobility layer between the source and drain regions through which charge carriers flow from the source region to the drain region; and a gate electrically coupled to a voltage source that controls the flow of charge carriers in the channel region, wherein a low mobility layer separates the gate from the channel region.

17. The semiconductor device of claim 16, wherein the continuous strain inducing or high mobility layer comprises a single crystal.

18. The semiconductor device of claim 17, wherein the continuous strain inducing or high mobility layer comprises a single SiGe or Ge crystal which is formed epitaxially on the substrate.

19. The semiconductor device of claim 17, wherein the continuous strain inducing or high mobility layer comprises a single Si crystal which is epitaxially grown on a single SiGe crystal which is epitaxially grown a Si substrate.

20. The semiconductor device of claim 16, wherein the low mobility layer comprises SiGe, Ge, or a combination thereof.

21. The method of claim 1, wherein the recess comprises a sigma-shaped or anisotropic etch profile with a flat lower recess surface under the gate.

22. The semiconductor device of claim 16, wherein an interface between the continuous strain inducing or high mobility layer and the substrate comprises a sigma-shaped or anisotropic profile with a flat lower recess surface under the gate.

* * * * *